United States Patent
Fattaruso et al.

(10) Patent No.: US 7,528,759 B2
(45) Date of Patent: May 5, 2009

(54) PIPELINED ANALOG-TO-DIGITAL CONVERTER

(75) Inventors: John William Fattaruso, Dallas, TX (US); Marco Corsi, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/856,448

(22) Filed: Sep. 17, 2007

(65) Prior Publication Data

US 2009/0073016 A1    Mar. 19, 2009

(51) Int. Cl.
*H03M 1/34* (2006.01)

(52) U.S. Cl. .................. 341/162; 341/135; 341/136; 341/155; 341/161

(58) Field of Classification Search ............ 341/135, 341/136, 161, 162
See application file for complete search history.

(56) References Cited

U.S. PATENT DOCUMENTS

| | | | |
|---|---|---|---|
| 6,366,230 B1 | 4/2002 | Zhang et al. | |
| 6,441,769 B1 | 8/2002 | Nagaraj | |
| 6,587,065 B1 * | 7/2003 | Hensley et al. | ............... 341/161 |
| 6,650,263 B1 | 11/2003 | Dillon | |
| 6,686,864 B1 | 2/2004 | Moreland | |
| 7,002,501 B2 | 2/2006 | Gulati et al. | |
| 7,042,383 B2 | 5/2006 | Mishra et al. | |
| 7,126,415 B2 | 10/2006 | Maloberti et al. | |
| 7,268,720 B1 * | 9/2007 | Murden | ....................... 341/161 |
| 7,382,308 B1 * | 6/2008 | Liang et al. | .................. 341/161 |
| 2007/0040580 A1 | 2/2007 | Zanchi et al. | |

* cited by examiner

*Primary Examiner*—Khai M Nguyen
(74) *Attorney, Agent, or Firm*—John J. Patti; Wade J. Brady, III; Frederick J. Telecky, Jr.

(57) ABSTRACT

One embodiment of the present invention includes a pipelined analog-to-digital converter (ADC) comprising a plurality of pipeline stages. At least one of the plurality of pipeline stages comprises a feedback transistor-follower combination interconnected between a positive source voltage and a summation node and configured to set a voltage of the summation node approximately equal to a sample-and-hold voltage associated with a preceding one of the plurality of pipeline stages. The at least one of the plurality of pipeline stages also comprises a current mirror coupled to the feedback transistor-follower combination configured to provide a first current that is approximately equal to a second current that is associated with the feedback transistor-follower combination. The at least one of the plurality of pipeline stages further comprises an output resistor configured to set an output voltage of the respective at least one of the plurality of pipeline stages based on the first current.

20 Claims, 3 Drawing Sheets

PIPELINED ANALOG-TO-DIGITAL CONVERTER

TECHNICAL FIELD

This invention relates to electronic circuits, and more specifically to a pipelined analog-to-digital converter.

BACKGROUND

Analog-to-digital conversion is a process that is often used in electronic devices to implement processing algorithms in the digital domain. As a result, the processing algorithms can be implemented in a much simpler manner, and with reduced chip size and reduced power consumption. There are a variety of different types of analog-to-digital converters (ADCs) in the market today, such as flash ADCs, switched-capacitor ADCs, and pipelined ADCs. Pipelined ADCs have become more prevalent as the demand for faster operation of electronic devices has increased. Specifically, pipelined ADCs can be implemented to quickly and efficiently convert analog input signals to high-resolution digital signals, such that the resolution of a pipelined ADC can be significantly greater than other types of ADCs without sacrificing speed of operation.

Figure 1:
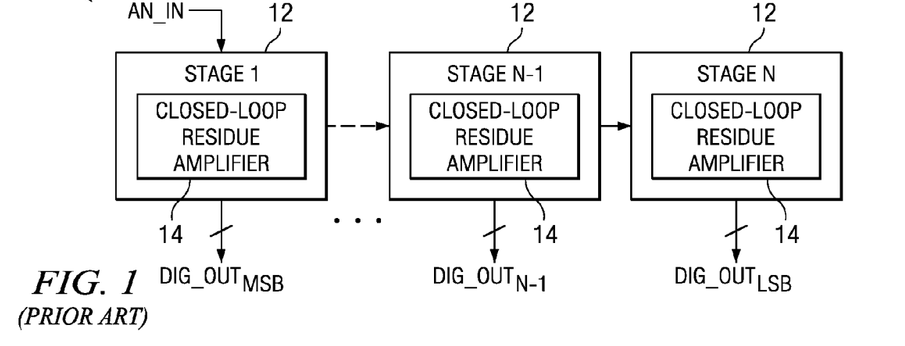
FIG. 1 illustrates an example of a typical pipelined analog-to-digital converter (ADC).

FIG. 1 illustrates an example of a typical pipelined ADC 10. The pipelined ADC 10 includes a plurality of pipeline stages 12, numbered 1 through N, where N is a positive integer. The first stage receives an analog input signal AN_IN as an input for which the pipelined ADC 10 is configured to provide a digital output signal DIG_OUT. The pipelined ADC 10 can be implemented in any of a variety of electronic devices, such as computers, portable electronic devices, and/or wireless communication devices.

Each of the pipeline stages 12 of the pipelined ADC 10 is configured to provide a specific portion of the digital output signal DIG_OUT. In the example of FIG. 1, the first pipeline stage 12, labeled STAGE 1, receives the analog input signal AN_IN and provides a most-significant bit portion of the digital output signal DIG_OUT, labeled DIG_OUT$_{MSB}$. The digital portion DIG_OUT$_{MSB}$ can include one or more of the most-significant bits of the digital signal DIG_OUT. The first pipeline stage 12 also outputs a residue voltage that is a sampled and held voltage of the analog input signal AN_IN.

The residue voltage is provided to a next pipeline stage 12 (not shown) which could provide the next most-significant bits of the digital output signal DIG_OUT based on the residue voltage provided from the preceding stage STAGE 1. Thus, similar to the first pipeline stage STAGE 1, the next pipeline stage provides a residue voltage to the next consecutive stage, and so forth, up to the last pipeline stage 12, demonstrated as STAGE N in the example of FIG. 1. The last stage STAGE N receives a residue voltage from a next-to-last stage, STAGE N−1, and generates the least-significant bit portion of the digital output signal DIG_OUT, demonstrated as DIG_OUT$_{LSB}$ in the example of FIG. 1. The digital portion DIG_OUT$_{LSB}$ can include one or more of the least-significant bits of the digital signal DIG_OUT. Therefore, the digital output signal DIG_OUT, in its entirety, includes each of the digital portions DIG_OUT$_{MSB}$, DIG_OUT$_{LSB}$, and all digital portions in between. As a result, a high digital resolution can be achieved for a given sample of the analog input signal AN_IN that is converted to the digital domain.

Upon generating a respective digital portion DIG_OUT$_X$ of the digital output signal DIG_OUT, where X is a positive integer that denotes a number corresponding to the specific stage, each of the pipeline stages 12 is configured to generate a residue portion of the analog input signal AN_IN and transfer the residue portion to the next stage. Therefore, each of the pipeline stages 12 includes a closed-loop residue amplifier 14. The closed-loop residue amplifier 14 in the first pipeline stage STAGE 1 is configured to receive the sampled-and-held analog input signal AN_IN and to generate a residue voltage that corresponds to the residue of the most-significant digital portion DIG_OUT$_{MSB}$. The remaining pipeline stages 12 are each configured to sample-and-hold the residue voltage provided from the preceding pipeline stage 12 and to generate a residue voltage that corresponds to the residue of the digital portion of the respective pipeline stage 12 via the respective closed-loop residue amplifier 14. Thus, the residue voltage V$_{RES\_X}$ corresponds to the residue provided to the respective pipeline stage 12 minus the digital portion DIG_OUT$_X$ of the respective pipeline stage 12.

Figure 2:
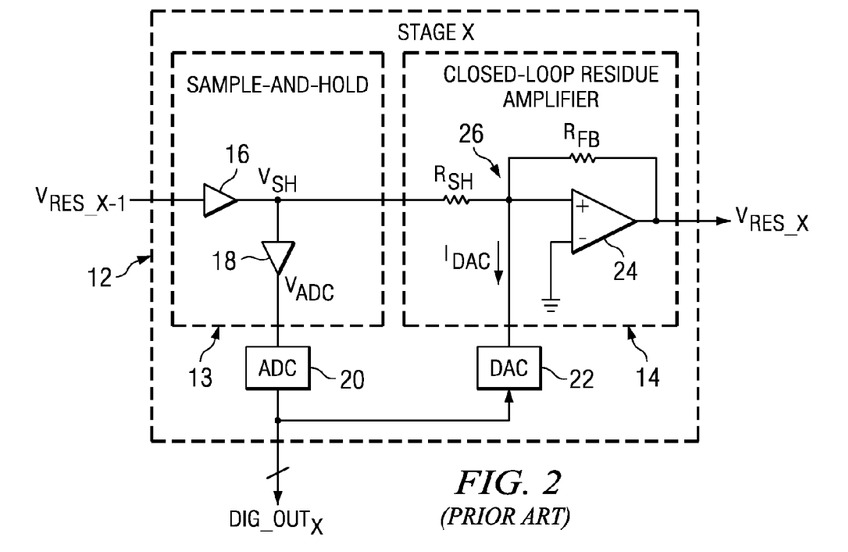
FIG. 2 illustrates an example of a pipeline stage of a typical pipelined ADC.

FIG. 2 illustrates an example of a pipeline stage 12 of the pipelined ADC 10 of the example of FIG. 1. The pipeline stage 12 in the example of FIG. 2 will be referred to as STAGE X in the discussion herein, such that STAGE X can refer to any of the pipeline stages 12 in the example of FIG. 1. STAGE X includes a sample-and-hold portion 13 and the closed-loop residue amplifier 14. The sample-and-hold portion 13 receives a residue voltage V$_{RES\_X-1}$ from the previous pipeline stage (denoted as X−1 since FIG. 2 demonstrates STAGE X). The residue voltage V$_{RES\_X-1}$ is provided to a sample-and-hold circuit 16, which samples and holds the residue voltage V$_{RES\_X-1}$ to generate a sample-and-hold voltage V$_{SH}$ for STAGE X. The sample-and-hold voltage V$_{SH}$ is provided to a current buffer 18 to generate a voltage V$_{ADC}$, which is output from the current buffer 18 to a local ADC 20. As an example, the local ADC 20 can be a flash ADC. The voltage V$_{ADC}$ can be substantially equal to the sample-and-hold voltage V$_{SH}$, such that the voltage V$_{ADC}$ can have an associated current that is sufficient to drive a large capacitive load associated with the local ADC 20. The local ADC 20 thus converts the voltage V$_{ADC}$ to a digital portion DIG_OUT$_X$ of the digital output signal DIG_OUT. The digital portion DIG_OUT$_X$ is also provided to a local digital-to-analog converter (DAC) 22 configured to convert the digital portion DIG_OUT$_X$ back to an analog form.

The closed-loop residue amplifier 14 includes an operational amplifier (OP-AMP) 24 that is arranged in a closed-loop, feedback configuration. Specifically, the OP-AMP 24 has an inverting input that is grounded, and an output that is fed back through a feedback resistor R$_{FB}$ to a summation node 26 at a non-inverting input of the OP-AMP 24. The sample-and-hold voltage V$_{SH}$ is also provided to the summation node 26 through a resistor R$_{SH}$, and a current I$_{DAC}$ flows from the summation node 26 to the DAC 22. The current I$_{DAC}$ can represent a quantization level of the digital portion DIG_OUT$_X$. Therefore, the summation node 26 is a node from which the quantization level of the digital portion DIG_OUT$_X$ is subtracted from the sample-and-hold voltage V$_{SH}$ across the residue resistor R$_{SH}$.

Because the OP-AMP 24 is arranged in a closed-loop, feedback configuration, the output of the OP-AMP 24 is amplified to generate a highly linear output. Specifically, the linearity in the closed-loop configuration of the OP-AMP 24 is achieved based on the substantially high linearity of the passive resistors R$_{FB}$ and R$_{SH}$, particularly in the resistor R$_{FB}$ being enclosed in the feedback loop of the OP-AMP 24. The highly linear output is thus provided as a residue voltage V$_{RES\_X}$ that corresponds to the residue of the voltage provided to the pipeline stage STAGE X (i.e., the residue voltage V$_{RES\_S-1}$ from the previous pipeline stage) minus the quantization level of the digital portion DIG_OUT$_X$. The residue voltage $V_{RES\_X}$ is output from STAGE X to the next pipeline stage 12 of the pipelined ADC 10, unless STAGE X is the last pipeline stage 12 in the pipelined ADC 10 (i.e., X=N).

In the examples of FIGS. 1 and 2, each of the signals (e.g., residue voltages) and each of the components are demonstrated as single-ended. However, it is to be understood that each of the signals and components in the examples of FIGS. 1 and 2 can be implemented as differential, such that a given residue voltage $V_{RES}$ can be either a positive portion $V_{RES}+$ or a negative portion $V_{RES}-$ of a fully differential residue voltage.

As described above, pipelined ADCs can be implemented to provide high resolution digital representations of analog signals very quickly, thus making them very desirable in a variety of electronic device applications. However, because each of the stages amplifies the residue voltage that is provided from the preceding stage in a highly linear manner, and because each of the residue voltages that is sampled and held at each stage is current buffered before being provided to the local ADC, a given pipelined ADC can consume a substantial amount of power. In addition, the OP-AMP components of the closed-loop residue amplifiers can be physically large, such that they can occupy substantial space in an integrated circuit (IC). Such power consumption and size are directly adverse to the goal of reducing power and accommodating the consumer demand for a continuous reduction in size of electronic portable devices. In addition, these devices are typically battery powered, and it is desirable to utilize as little power as possible to operate these devices so that the battery life can be extended. As such, pipelined ADCs typically operate under the trade-off constraints of speed and high resolution at the cost of substantial power consumption and size.

SUMMARY

One embodiment of the present invention includes a pipelined analog-to-digital converter (ADC) comprising a plurality of pipeline stages. At least one of the plurality of pipeline stages comprises a feedback transistor-follower combination interconnected between a positive source voltage and a summation node and configured to set a voltage of the summation node approximately equal to a sample-and-hold voltage associated with a preceding one of the plurality of pipeline stages. The at least one of the plurality of pipeline stages also comprises a current mirror coupled to the feedback transistor-follower combination configured to provide a first current that is approximately equal to a second current that is associated with the feedback transistor-follower combination. The at least one of the plurality of pipeline stages further comprises an output resistor configured to set an output voltage of the respective at least one of the plurality of pipeline stages based on the first current.

Another embodiment of the present invention includes a method for providing a portion of a digital output signal of a pipelined ADC. The method comprises biasing a feedback transistor-follower combination to set a voltage of a summation node approximately equal to a sample-and-hold voltage associated with a preceding pipeline stage of the pipelined ADC. The method also comprises subtracting a quantization current associated with a local digital-to-analog converter (DAC) from the summation node. The local DAC can be configured to provide an analog version of a second portion of the digital output signal associated with the preceding pipeline stage of the pipelined ADC. The method also comprises mirroring a first current from a positive source voltage to the summation node through the feedback transistor-follower combination to provide a second current through an output resistor to set an output voltage of the pipeline stage. The method further comprises converting the output voltage to a digital representation that is the portion of the digital output signal of the pipelined ADC.

Another embodiment of the present invention includes a pipelined analog-to-digital converter (ADC) comprising a plurality of pipeline stages. At least one of the plurality of pipeline stages comprises means for setting a voltage of a summation node approximately equal to a sample-and-hold voltage associated with a preceding one of the plurality of pipeline stages. The at least one of the plurality of pipeline stages also comprises means for mirroring a first current associated with the means for setting the voltage of the summation node to provide a second current to an output resistor to set an output voltage of the respective at least one of the plurality of pipeline stages based on the second current. The at least one of the plurality of pipeline stages further comprises means for converting the output voltage to a digital representation that is a portion of a digital output signal of the pipelined ADC.

DETAILED DESCRIPTION

The present invention relates to electronic circuits, and more specifically to a pipelined analog-to-digital converter (ADC). The pipelined ADC can be implemented in one or more of the end stages of a pipelined ADC, such that the open-loop pipelined ADC stage can generate one or more of the least-significant bits of the digital output signal of the pipelined ADC. The open-loop pipelined ADC stage includes an open-loop residue amplifier. The open-loop residue amplifier includes a feedback transistor-follower combination that sets a summation node voltage approximately equal to the sample-and-hold voltage of the preceding stage of the pipelined ADC. The feedback transistor-follower combination can be implemented with bipolar junction transistors (BJTs), and can include a bias current source that is implemented with P-type metal oxide semiconductor (PMOS) devices.

A current flow through the feedback transistor-follower combination is mirrored to an output resistor, such that the output resistor sets the output voltage for the open-loop pipelined ADC stage. The output voltage can also control an input of a transistor that, combined with a current source, can act as a current buffer, such that the output voltage can be current buffered before being provided to a local ADC. In addition, the open-loop residue amplifier can include a clamping circuit that is configured to clamp the output voltage to a desired magnitude within the full-scale range of the pipelined ADC in response to transient conditions that can cause the mirrored current to be excessive. The open-loop residue amplifier can thus be implemented as a substantially smaller and less power consuming package than a typical closed-loop residue amplifier in a pipeline stage of a pipelined ADC.

Figure 3:
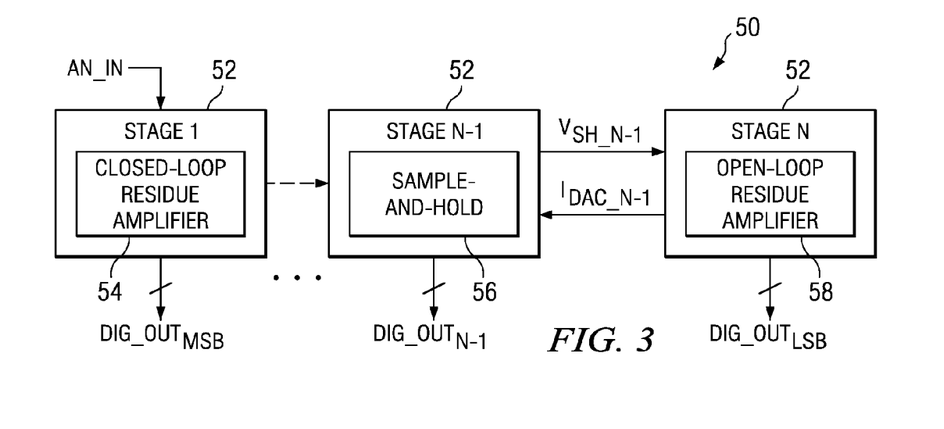
FIG. 3 illustrates an example of a pipelined ADC in accordance with an aspect of the invention.

FIG. 3 illustrates an example of a pipelined ADC 50 in accordance with an aspect of the invention. The pipelined ADC 50 can be implemented in any of a variety of electronic devices, such as computers, portable electronic devices, and/or wireless communication devices. The pipelined ADC 50 includes a plurality of pipeline stages 52, numbered 1 through N, where N is a positive integer. The first stage 52, demonstrated as STAGE 1 in the example of FIG. 3, receives an analog input signal AN_IN as an input for which the pipelined ADC 50 is configured to provide a digital output signal DIG_OUT.

Each of the pipeline stages 52 of the pipelined ADC 50 is configured to provide a specific portion of the digital output signal DIG_OUT. In the example of FIG. 3, the first pipeline stage 52 receives the analog input signal AN_IN and provides a most-significant bit portion of the digital output signal DIG_OUT, labeled DIG_OUT$_{MSB}$. The digital portion DIG_OUT$_{MSB}$ can include one or more of the most-significant bits of the digital signal DIG_OUT. The first pipeline stage 52 also outputs a residue voltage that is a residue of the analog input signal AN_IN minus the quantization level of the digital portion DIG_OUT$_{MSB}$.

The residue voltage is provided to a next pipeline stage 52 (not shown), which could provide the next most-significant bits of the digital output signal DIG_OUT based on the residue voltage provided from the preceding stage STAGE 1. Thus, similar to the first pipeline stage STAGE 1, the next pipeline stage provides a residue voltage to the next consecutive stage, and so forth, up to the last pipeline stage 52, demonstrated as STAGE N in the example of FIG. 3. The last stage STAGE N generates the least-significant portion of the digital output signal DIG_OUT, demonstrated as DIG_OUT$_{LSB}$ in the example of FIG. 3. The digital portion DIG_OUT$_{LSB}$ can include one or more of the least-significant bits (LSBs) of the digital signal DIG_OUT. Therefore, the digital output signal DIG_OUT, in its entirety, includes each of the digital portions DIG_OUT$_{MSB}$, DIG_OUT$_{LSB}$, and all digital portions in between. As a result, a high digital resolution can be achieved for a given sample of the analog input signal AN_IN.

In the example of FIG. 3, the first pipeline stage STAGE 1 includes a sample-and-hold portion (not shown) and a closed-loop residue amplifier 54, similar to as described above regarding the example of FIG. 2. Thus, the most-significant digital portion DIG_OUT$_{MSB}$ and one or more of the next most-significant digital portions can be very accurate representations of the analog input signal AN_IN based on the highly linear characteristics of the operational amplifier (OP_AMP) that is included in the respective closed-loop amplifier 54, such as similar to the highly linear resistor feedback arrangement of the OP-AMP 18 in the example of FIG. 2. Such accuracy may be necessary to properly represent the analog input signal AN_IN, particularly with regard to the most-significant bits of the digital output signal DIG_OUT. In addition, one or more additional pipeline stages 52 of the pipelined ADC 50 can include a closed-loop residue amplifier 54 to maintain accurate digital representation of the analog input signal AN_IN based on the high linearity of the closed-loop residue amplifiers 54.

As described above in the example of FIGS. 1 and 2, it may be important for the first one or more pipeline stages 52 of the pipelined ADC 50 to be highly linear to provide accurate digital portions of the most-significant bits (MSBs) of the digital output signal DIG_OUT. However, it may not be as important for the last one or more pipeline stages 52 of the pipelined ADC 50 to be highly linear, as it is typically not necessary to achieve extreme accuracy of the LSBs of the digital output signal DIG_OUT. Therefore, the last one or more pipeline stages 52 of the pipelined ADC 50 may not require implementation of a highly linear and high power consuming OP-AMP.

In the example of FIG. 3, the second-to-last pipeline stage STAGE N−1 includes a sample-and-hold circuit 56 and the last pipeline stage STAGE N includes an open-loop residue amplifier 58. The combination of the sample-and-hold circuit 56 and the open-loop residue amplifier 58 are configured to operate similar to a sample-and-hold portion and closed-loop residue amplifier 54, respectively. However, the open-loop residue amplifier 58 may not include the highly linear resistor feedback arrangement of the closed-loop residue amplifier 54, and thus may not be as highly linear. Accordingly, the open-loop residue amplifier 58 may consume substantially less power, as is described in greater detail below.

The sample-and-hold circuit 56 in the pipeline stage STAGE N−1 may be configured substantially similar to the sample-and-hold portion 13, such as demonstrated in the example of FIG. 2. As such, the sample-and-hold circuit 56 can generate a sample-and-hold voltage V$_{SH\_N-1}$ of the residue voltage provided by the prior pipeline stage 52. The pipeline stage STAGE N−1 can thus also include a local ADC that is configured to convert a current buffered version of the sample-and-hold voltage V$_{SH\_N-1}$ to the digital portion DIG_OUT$_{N-1}$. The digital portion DIG_OUT$_{N-1}$ can also be provided to a local digital-to-analog converter (DAC) within the pipeline stage STAGE N−1, similar to as demonstrated in the example of FIG. 2.

The open-loop residue amplifier 58 is configured to receive the sample-and-hold voltage V$_{SH\_N-1}$ provided from the preceding pipeline stage STAGE N−1 and to subtract the quantization level of the digital portion DIG_OUT$_{N-1}$ at a summation node, demonstrated in the example of FIG. 3 as the current I$_{DAC\_N-1}$ flowing from the pipeline stage N to the pipeline stage N−1. A residue voltage that corresponds to the digital portion DIG_OUT$_{LSB}$ of the last pipeline stage STAGE N is generated from a mirrored current that is based on a current that is implemented to generate the voltage potential at the summation node. The residue voltage is current buffered before being converted to the digital portion DIG_OUT$_{LSB}$.

It is to be understood that the sample-and-hold circuit 56 and open-loop residue amplifier 58 are not limited to being implemented in the last two stages, STAGE N−1 and STAGE N, respectively, of the pipelined ADC 50. As an example, the combination of the sample-and-hold circuit 56 and open-loop residue amplifier 58 can be implemented in the last several pipeline stages 52 of the pipelined ADC 50. Specifically, the combination of the sample-and-hold circuit 56 and open-loop residue amplifier 58 can be implemented in any pipeline stages 52 in which high linearity may not be an essential requirement.

Figure 4:
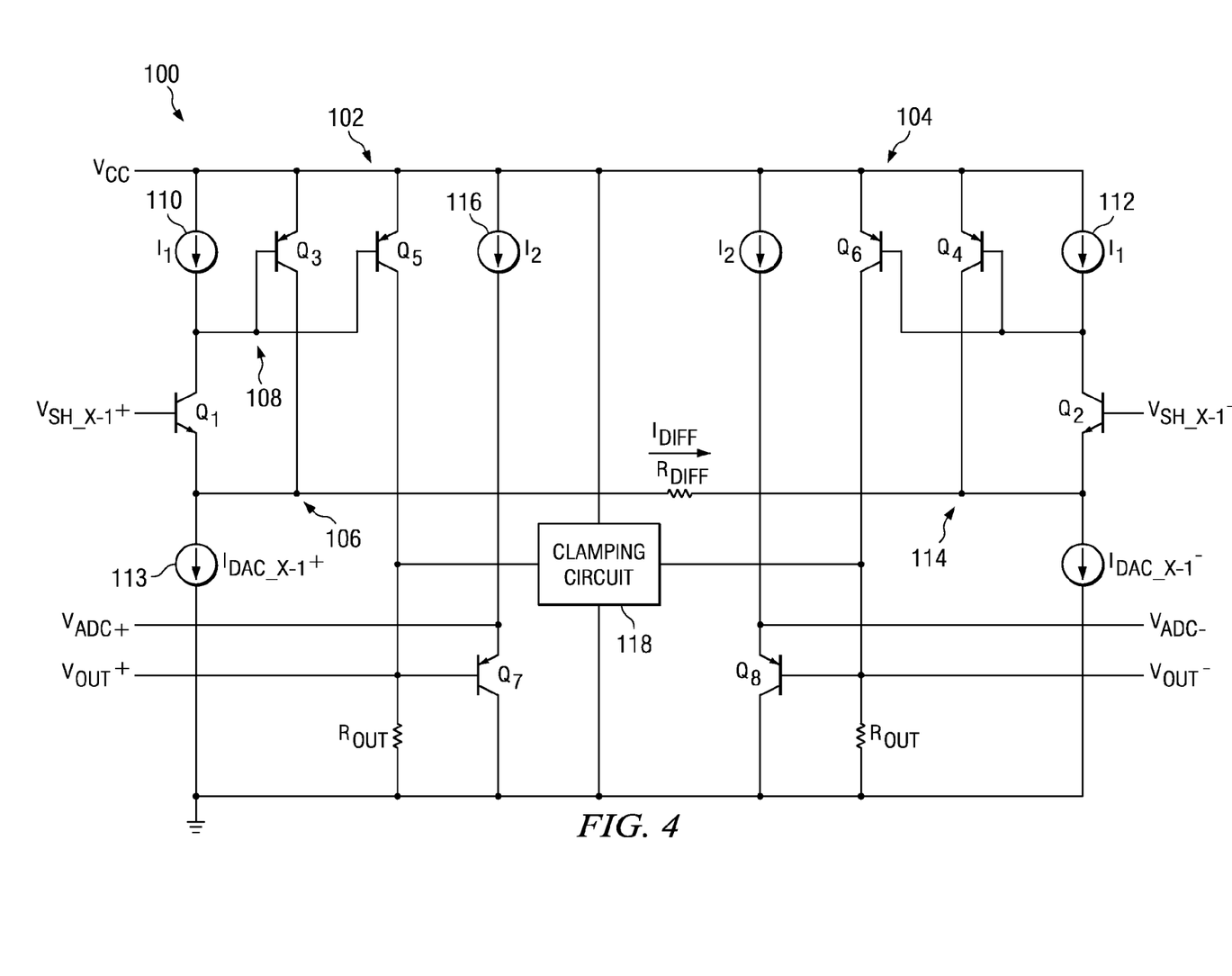
FIG. 4 illustrates an example of an open-loop residue amplifier of a pipeline stage in accordance with an aspect of the invention.

FIG. 4 illustrates an example of an open-loop residue amplifier 100 of a pipeline stage in accordance with an aspect of the invention. The open-loop residue amplifier 100 can be configured substantially the same as the open-loop residue amplifier 58 in the example of FIG. 3. As such, reference is to be made to the example of FIG. 3 in the discussion of the example of FIG. 4. Furthermore, similar to the example of FIG. 2 above, the open-loop residue amplifier 100 in the example of FIG. 4 is referred to as being in STAGE X of a given pipelined ADC, as the open-loop residue amplifier 100 is not limited to being implemented in a last stage of the given pipelined ADC. Thus, the preceding pipeline stage in the given pipelined ADC is referred to as being STAGE X−1 in the example of FIG. 4.

The open-loop residue amplifier 100 is configured between a positive source voltage $V_{CC}$ and a negative source voltage, demonstrated as ground in the example of FIG. 4. The open-loop residue amplifier 100 is demonstrated in the example of FIG. 4 as being fully differential, such that it includes a positive portion 102 and a negative portion 104. The positive portion 102 and the negative portion 104 are configured substantially identically, and are separated by a differential resistor $R_{DIFF}$. As such, the discussion of the example of FIG. 4 is mostly focused on the positive portion 102, but that the discussion applies substantially equally to the negative portion 104.

A positive portion of the sample-and-hold voltage $V_{SH\_X-1}+$ from the preceding pipeline stage is provided to a base of an NPN BJT $Q_1$. The BJT $Q_1$ has an emitter that is coupled to a summation node 106 and a collector that is coupled to an intermediate node 108. A bias current source 110 provides a current $I_1$ from the positive source voltage $V_{CC}$ to the intermediate node 108. In addition, a PNP BJT $Q_3$ is interconnected between the positive source voltage $V_{CC}$ and the summation node 106, with a base that is coupled to the intermediate node 108. Therefore, the bias current source 110, the BJT $Q_1$, and the BJT $Q_3$ are configured as a feedback transistor-follower combination. Specifically, the current $I_1$ biases the BJT $Q_1$, which induces a current flow through the feedback BJT $Q_3$. As a result of the operation of the feedback transistor-follower combination, the positive portion of the sample-and-hold voltage $V_{SH\_X-1}+$ from the preceding pipeline stage is copied onto the summation node 106 in a linear manner.

The negative portion 104 of the open-loop residue amplifier 100 includes a current source 112, a BJT $Q_2$, and a BJT $Q_4$ that are likewise configured as a feedback transistor-follower combination. The current source 112 also provides the current $I_1$, such that it is substantially equal to the current $I_1$ provided by the current source 110. As a result, a negative portion of the sample-and-hold voltage $V_{SH\_X-1}-$ from the preceding pipeline stage is copied onto a summation node 114. The differential resistor $R_{DIFF}$ separates the summation node 106 from the summation node 114. Thus, a differential current $I_{DIFF}$ flows across the differential resistor $R_{DIFF}$. The current $I_{DIFF}$ is thus set based on the operation of the feedback transistor-follower combination of the bias current source 110, the BJT $Q_1$, and the BJT $Q_3$, as well as the bias current source 112, the BJT $Q_2$, and the BJT $Q_4$.

The open-loop residue amplifier 100 includes a current source 113 that draws a current $I_{DAC\_X-1}+$ from the summation node 106. The current $I_{DAC\_X-1}+$ is representative of a quantization level current of the preceding pipeline stage of the pipelined ADC. Thus, the current source 113 is representative of the current drawn from a local DAC, such as the local DAC 22 in the example of FIG. 2. Therefore, the summation node 106 is a node from which the quantization level current $I_{DAC\_X-1}+$ is subtracted from the sample-and-hold voltage $V_{SH\_X-1}+$. Accordingly, the BJT $Q_3$ provides an amount of current that is necessary to maintain the copied sample-and-hold voltage $V_{SH\_X-1}+$ onto the summation node 106. Specifically, the current provided by the BJT $Q_3$ can be approximately equal to the quantization level current $I_{DAC\_X-1}+$ minus the current $I_1$.

The open-loop residue amplifier 100 includes a PNP BJT $Q_5$ that has an emitter coupled to the positive source voltage $V_{CC}$ and a base that is coupled to the intermediate node 108. As a result, the BJT $Q_5$ is configured to mirror the current that flows through the BJT $Q_3$, such that the current flow through the BJT $Q_5$ is substantially equal to the current flow through the BJT $Q_3$. The BJT $Q_5$ has a collector that is coupled to an output resistor $R_{OUT}$. As described above, the current flow through the BJT $Q_3$ is an amount that is necessary to maintain the sample-and-hold voltage $V_{SH\_X-1}+$ at the summation node 106, from which the quantization current $I_{DAC\_X-1}+$ of the preceding pipeline stage is subtracted. Therefore, the current flow through the BJT $Q_5$ generates an output voltage $V_{OUT}+$ across the output resistor $R_{OUT}$, such that the output voltage $V_{OUT}+$ is the voltage corresponding to a sampled and held residue voltage of the pipeline stage in which the open-loop residue amplifier 100 is included.

The output voltage $V_{OUT}+$ is provided to a base of a PNP BJT $Q_7$. The BJT $Q_7$ has a collector coupled to ground and an emitter coupled to a current source 116 that is configured to provide a current $I_2$. Therefore, the current source 116 and the BJT $Q_7$ are arranged in an emitter-follower configuration, such that the current source 116 and the BJT $Q_7$ are configured as a current buffer for the output voltage $V_{OUT}+$. Accordingly, a voltage $V_{ADC}+$ is generated at the emitter of the BJT $Q_7$. The voltage $V_{ADC}+$ can be a current buffered version of the output voltage $V_{OUT}+$, such that it can be provided to a local ADC, such as a flash ADC. Thus, the local ADC can convert the voltage $V_{ADC}+$ to a digital representation, such that the digital representation can be the digital portion $DIG\_OUT_X$ of the pipeline stage in which the open-loop residue amplifier 100 is included.

The sample-and-hold voltage $V_{SH\_X-1}$ that is input the open-loop residue amplifier 100 from the preceding pipeline stage can be subject to transient voltage swings. As a result, the output voltage $V_{OUT}$ could likewise increase in response to the transient voltage swing, which could saturate transistors in the local ADC. As such, the transistors could capacitively store charge, which could cause digital conversion errors of the pipeline stage in which the open-loop residue amplifier 100 is implemented. Therefore, the open-loop residue amplifier 100 includes a clamping circuit 118 that is coupled to the collector of the BJT $Q_5$, and thus the output voltage $V_{OUT}+$. The clamping circuit 118 is configured to clamp the output voltage $V_{OUT}$ to a desired magnitude within the full-scale range of the pipelined stage in which the open-loop residue amplifier 100 is included in response to transient conditions that can cause excessive current flow through the BJT $Q_5$. As a result, conversion errors of the voltage $V_{ADC}$ to the local ADC can be substantially mitigated.

Figure 5:
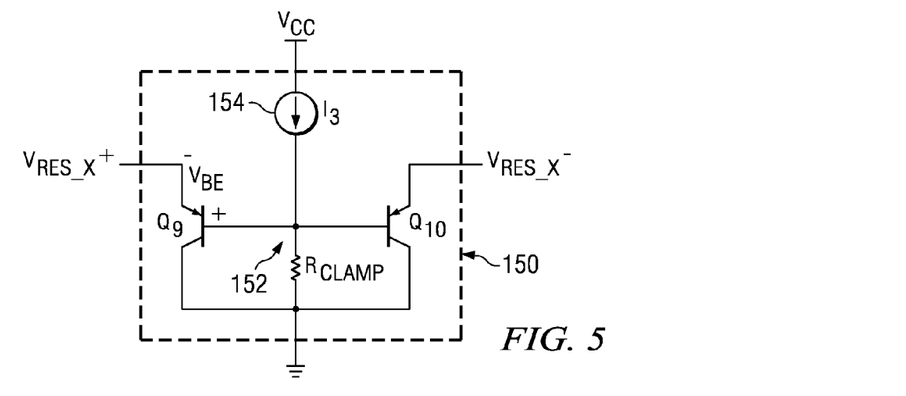
FIG. 5 illustrates an example of a clamping circuit of an open-loop residue amplifier of a pipeline stage in accordance with an aspect of the invention.

FIG. 5 illustrates an example of a clamping circuit 150 of an open-loop residue amplifier of a pipeline stage in accordance with an aspect of the invention. The clamping circuit 150 can be substantially similar to the clamping circuit 118 in the example of FIG. 4. Therefore, reference is to be made to the example of FIG. 4 in the discussion of FIG. 5.

The clamping circuit 150 is demonstrated as interconnecting the positive source voltage $V_{CC}$ and ground. The clamping circuit 150 includes a PNP BJT $Q_9$ having a collector coupled to ground and an emitter coupled to the positive portion of the output voltage $V_{OUT}+$. The clamping circuit 150 also includes a PNP BJT $Q_{10}$ having a collector coupled to ground and an emitter coupled to the negative portion of the output voltage $V_{OUT}-$. The bases of each of the BJTs $Q_9$ and $Q_{10}$ are coupled to a node 152. A resistor $R_{CLAMP}$ interconnects the bases and the collectors of each of the BJTs $Q_9$ and $Q_{10}$. In addition, a current source 154 provides a current $I_3$ from the positive source voltage $V_{CC}$ to the node 152.

The resistance value of the resistor $R_{CLAMP}$ and the magnitude of the current $I_3$ can each be sized to provide a specific bias point at the node 152. The specific bias point can correspond to a voltage potential at which the BJTs $Q_9$ and $Q_{10}$ activate to clamp the output voltage $V_{OUT}$ upon the output voltage $V_{OUT}$ reaching an excessive value. Specifically, the resistance value of the resistor $R_{CLAMP}$ and the magnitude of the current $I_3$ can be set such that a DC bias level at the bases of the BJTs $Q_9$ and $Q_{10}$ can be approximately the same as the quiescent voltages across the output resistors $R_{OUT}$. As a result, the differential output swing of the output voltage $V_{OUT}$ can be clamped at a magnitude of approximately a base-emitter voltage $V_{BE}$ of the BJTs $Q_9$ and $Q_{10}$. Accordingly, upon an input transient condition of the sample-and-hold voltage $V_{SH\_X-1}$ of the preceding pipeline stage, the output voltage $V_{OUT}$ does not achieve a magnitude high enough to cause saturation of transistors within the local ADC, thus mitigating conversion errors resulting from stored charge.

Referring back to the example of FIG. 4, the bias current sources 110 and 112 can be configured to provide a substantially equal amount of current $I_1$, as described above. The current $I_1$ can be based on the operation of local DAC. For example, the current $I_1$ can be based on a unit current developed in a single LSB cell of the local DAC. In addition, the current source 154 in the example of FIG. 5 can likewise be based on the operation of the local DAC. Therefore, the bias current sources 110 and 112, as well as the current source 154, can all be generated from the same mechanism.

Figure 6:
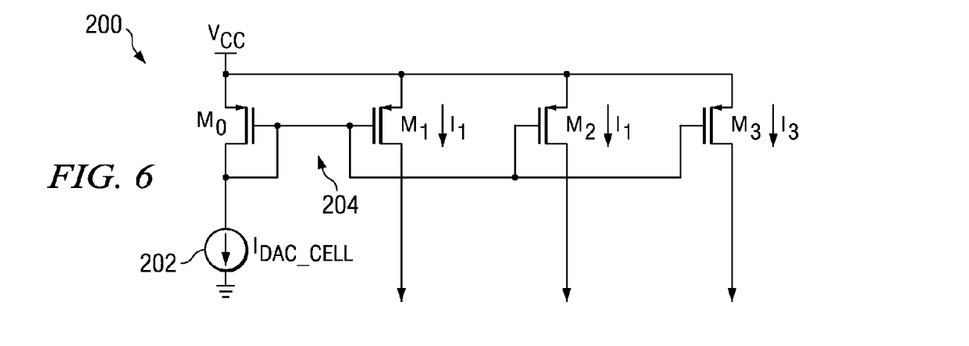
FIG. 6 illustrates an example of a current mirror current supply of an open-loop residue amplifier of a pipeline stage in accordance with an aspect of the invention.

FIG. 6 illustrates an example of a current-mirror current supply 200 of an open-loop residue amplifier in accordance with an aspect of the invention. The current-mirror current supply 200 can be implemented in the open-loop residue amplifier 100 in the example of FIG. 4, and can be configured to be implemented for the clamping circuit 150, as well. Therefore, reference is to be made to the examples of FIGS. 4 and 5 in the discussion of FIG. 6.

The current-mirror current supply 200 is demonstrated in the example of FIG. 6 as being configured between the positive source voltage $V_{CC}$ and ground. A current supply 202 provides a current $I_{DAC\_CELL}$ from a control node 204 to ground. The current $I_{DAC\_CELL}$ can be a current that is representative of one LSB cell of the current-steering local DAC, and can be scaled to the full-scale current of the pipeline stage in which the open-loop residue amplifier 100 is included. The current-mirror current supply 200 includes a diode-configured P-type metal oxide semiconductor (PMOS) transistor $M_0$, which forms a portion of a current mirror. Specifically, the current $I_{DAC\_CELL}$ flows from the positive source voltage $V_{CC}$ through the PMOS $M_0$.

The current-mirror current supply 200 includes a plurality of additional PMOS transistors, demonstrated as PMOS transistors $M_1$, $M_2$, and $M_3$ in the example of FIG. 6. The PMOS transistors $M_1$, $M_2$, and $M_3$ each have a gate terminal that is coupled to the control node 204. As a result, the current $I_{DAC\_CELL}$ through the PMOS transistors $M_0$ is mirrored through each of the PMOS transistors $M_1$, $M_2$, and $M_3$. Specifically, in the example of FIG. 6, the PMOS transistors $M_1$ and $M_2$ each conduct the current $I_1$ in the feedback transistor-follower combinations of the positive portion 102 and the negative portion 104, respectively, and the PMOS transistor $M_3$ conducts the current $I_3$ to the node 152 in the clamping circuit 150. The gate-widths of the PMOS transistors $M_1$, $M_2$, and $M_3$ can be configured different from the PMOS transistor $M_0$, such that the currents $I_1$ and $I_3$ can be proportional to the current $I_{DAC\_CELL}$. The PMOS transistors $M_1$ and $M_2$ can have equal gate-widths, such that each conducts the substantially equal currents $I_1$. However, as described above regarding the example of FIG. 5, the magnitude of the current $I_3$ can be selected to set the bias point of the BJTs $Q_9$ and $Q_{10}$. Therefore, the gate-width of the PMOS transistor $M_3$ can be configured to achieve the desired range of the current $I_3$.

By basing the magnitudes of the currents $I_1$ and $I_3$ on the unit current developed in the LSB cell of the local DAC, the bias currents of the BJTs in the open-loop residue amplifier 100 can track any variations in the cell current of the local DAC. Therefore, the BJTs in the open-loop residue amplifier 100 can conduct current in fixed relative ratios to the unit current developed in the LSB cell of the local DAC. In addition, by implementing PMOS devices for the current sources 110, 112, and 154 (e.g., PMOS transistors $M_1$, $M_2$, and $M_3$), the open-loop residue amplifier 100 is configured to mitigate the deleterious effects of transient inputs of the sample-and-hold voltage $V_{SH\_X-1}$ from the preceding pipeline stage that are beyond the linear range of the open-loop residue amplifier 100. Specifically, if the current sources 110, 112, and 154 were implemented as BJT devices, transient input conditions of the sample-and-hold voltage $V_{SH\_X-1}$ from the preceding pipeline stage could drive the BJT devices in the current sources 110, 112, and 154 into saturation, which could result in charge storage that could take several conversion cycles to drain. The stored charge could affect the magnitude of the output voltage $V_{OUT}$, and thus could result in conversion errors. However, by implementing the current sources 110, 112, and 154 as PMOS transistors, transient conditions merely set the PMOS transistors in the ohmic region of operation, from which recovery is rapid. Thus, the deleterious effects of transient inputs of the sample-and-hold voltage $V_{SH\_X-1}$ from the preceding pipeline stage are mitigated.

Based on the configuration of the open-loop residue amplifier 100, considerable power savings in the pipelined ADC 50 can be realized. Specifically, the open-loop residue amplifier 100 requires bias currents for a limited number of devices, which results in substantially less power consumption than an OP-AMP 24, a sample-and-hold circuit 16, and a current buffer 18, for which the open-loop residue amplifier 100 can be a replacement. Although the closed-loop residue amplifier 14 in the example of FIG. 2 can exhibit higher linearity, the feedback transistor-follower combination in the open-loop residue amplifier 100 provides sufficient linearity, particularly for the least-significant one or more stages of the pipelined ADC 50, and accomplishes conversion of the digital portions of the digital output signal DIG_OUT with significantly less power consumption.

It is to be understood that the open-loop residue amplifier 100 is not intended to be limited to the examples of FIGS. 4-6. Specifically, any of a variety of circuit combinations can be implemented to achieve substantially similar functionality of the open-loop residue amplifier 100. As a result, the open-loop residue amplifier 100 can be configured in any of a variety of ways.

Figure 7:
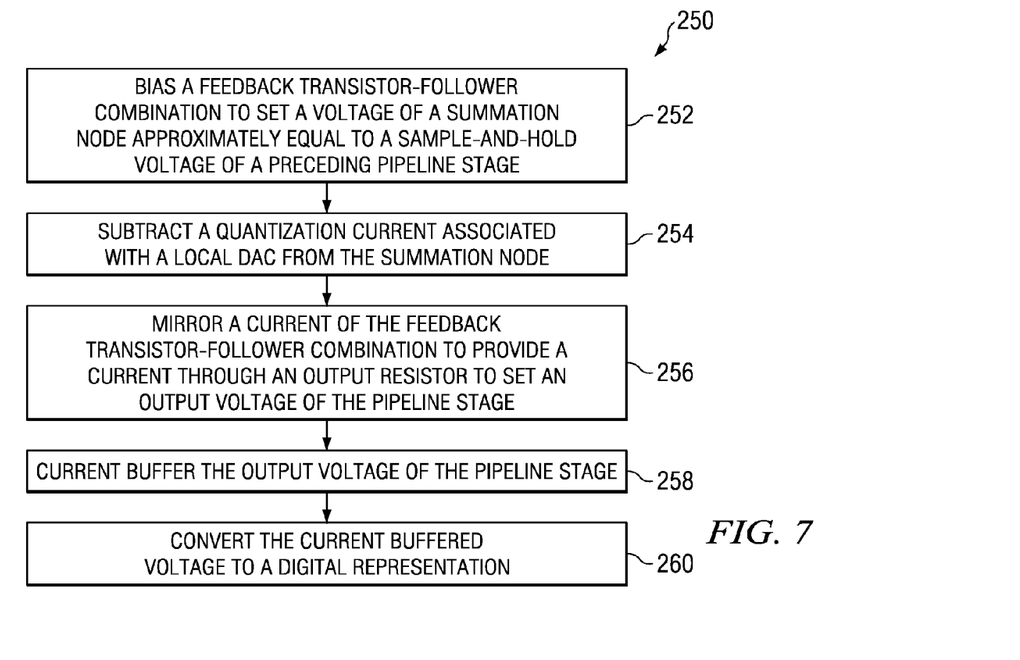
FIG. 7 illustrates an example of a method for providing a portion of a digital output signal of a pipelined ADC in accordance with an aspect of the invention.

In view of the foregoing structural and functional features described above, certain methods will be better appreciated with reference to FIG. 7. It is to be understood and appreciated that the illustrated actions, in other embodiments, may occur in different orders and/or concurrently with other actions. Moreover, not all illustrated features may be required to implement a method.

FIG. 7 illustrates an example of a method 250 for providing a portion of a digital output signal of a pipelined ADC in accordance with an aspect of the invention. At 252, a feedback transistor-follower combination is biased to set a voltage of a summation node approximately equal to a sample-and-hold voltage associated with a preceding pipeline stage of the pipelined ADC. The feedback transistor-follower combination can be configured as a current source operative to conduct current from a positive source voltage to an intermediate node, an NPN BJT interconnecting the intermediate node and the summation node, with a base controlled by the sample-and-hold voltage of the preceding pipeline stage, and a feedback transistor with a base coupled to the intermediate node and interconnecting the positive source voltage and the summation node. At 254, a quantization current associated with a local DAC associated with the preceding pipeline stage is subtracted from the summation node. The quantization current can be a current representing the quantization of the digital portion of the digital output signal of the preceding pipeline stage.

At 256, a current of the feedback transistor-follower combination is mirrored to provide a current through an output resistor to set an output voltage of the pipeline stage. The current through the feedback transistor-follower combination can be a current through the feedback transistor from the positive source voltage to the summation node. The current can be approximately equal to the quantization current of the local DAC minus the current of the current source in the feedback transistor-follower combination, such as necessary to maintain the sample-and-hold voltage of the preceding pipeline stage at the summation node. At 258, the output voltage of the pipeline stage is current buffered. The current buffering can occur through a current buffer that includes a current source and a PNP BJT having a base controlled by the output voltage, such that the current buffered output voltage is provided at the emitter of the PNP BJT. At 260, the current buffered output voltage is converted to a digital representation. The conversion can be by a local ADC, such as a flash ADC. The digital representation can be a portion of the digital output signal of the pipelined ADC.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A pipelined analog-to-digital converter (ADC) comprising a plurality of pipeline stages, at least one of the plurality of pipeline stages comprising:
    a feedback transistor-follower combination interconnected between a positive source voltage and a summation node and configured to set a voltage of the summation node approximately equal to a sample-and-hold voltage associated with a preceding one of the plurality of pipeline stages;
    a current mirror coupled to the feedback transistor-follower combination configured to provide a first current that is approximately equal to a second current that is associated with the feedback transistor-follower combination; and
    an output resistor configured to set an output voltage of the respective at least one of the plurality of pipeline stages based on the first current.

2. The pipelined ADC of claim 1, further comprising a current buffer configured to provide a current buffered version of the output voltage to a local ADC that is configured to generate a portion of an output digital signal of the pipelined ADC.

3. The pipelined ADC of claim 2, wherein the current buffer is configured as a PNP bipolar junction transistor (BJT) and a bias current source, the PNP BJT having a base controlled by the output voltage, a collector coupled to a negative source voltage, and an emitter at which the current buffered version of the output voltage is provided, such that the current buffer is arranged in an emitter-follower configuration.

4. The pipelined ADC of claim 1, wherein the feedback transistor-follower combination comprises:
    a current source configured to provide a bias current from the positive source voltage to an intermediate node;
    a first transistor having an input controlled by the sample-and-hold voltage associated with the preceding pipeline stage and is interconnected between the intermediate node and the summation node; and
    a second transistor having an input coupled to the intermediate node and is interconnected between the positive source voltage and the summation node.

5. The pipelined ADC of claim 4, wherein the current source is configured as a P-type metal-oxide semiconductor (PMOS) current mirror that is set by a current source representative of a least-significant bit (LSB) cell of a local digital-to-analog converter (DAC) configured to provide an analog version of a portion of the digital output signal associated with the preceding one of the plurality of pipeline stages.

6. The pipelined ADC of claim 4, wherein the second current is a current flow through the second transistor from the positive source voltage to the summation node and includes a quantization current component associated with a local DAC configured to provide an analog version of a portion of the digital output signal associated with the preceding one of the plurality of pipeline stages.

7. The pipelined ADC of claim 4, wherein the first transistor is configured as an NPN BJT and the second transistor is configured as a PNP BJT.

8. The pipelined ADC of claim 1, further comprising a clamping circuit configured to provide a limit to the output voltage upon an excessive amount of the first current.

9. The pipelined ADC of claim 8, wherein the clamping circuit comprises:
    a PNP BJT having an emitter coupled to the output voltage;
    a clamping resistor interconnected between a base and a collector of the PNP BJT; and
    a bias current source configured to provide a bias current from the positive source voltage to the base of the PNP BJT;
    wherein the bias current source and the clamping resistor are sized to set a voltage magnitude associated with the output voltage at which the PNP BJT activates to clamp the output voltage.

10. The pipelined ADC of claim 1, wherein feedback transistor-follower combination, the current mirror, and the output resistor form a first portion of the at least one of the plurality of pipeline stages, and wherein the sample-and-hold voltage associated with the preceding one of the plurality of pipeline stages is a first differential voltage and the output voltage of the respective at least one of the plurality of pipeline stages is a second differential voltage, the first portion being configured to receive a positive portion of the first differential voltage and to output a positive portion of the second differential voltage;
    the at least one of the plurality of pipeline stages further comprising a second portion configured substantially similar to the first portion and being configured to receive a negative portion of the first differential voltage and to output a negative portion of the second differential voltage, the first portion and the second portion being separated by a differential resistor that interconnects the summation node associated with the first portion and a summation node associated with the second portion.

11. A method for providing a portion of a digital output signal of a pipelined analog-to-digital converter (ADC), the method comprising:
   biasing a feedback transistor-follower combination to set a voltage of a summation node approximately equal to a sample-and-hold voltage associated with a preceding pipeline stage of the pipelined ADC;
   subtracting a quantization current associated with a local digital-to-analog converter (DAC) from the summation node, the local DAC being configured to provide an analog version of a second portion of the digital output signal associated with the preceding pipeline stage of the pipelined ADC;
   mirroring a first current from a positive source voltage to the summation node through the feedback transistor-follower combination to provide a second current through an output resistor to set an output voltage of the pipeline stage; and
   converting the output voltage to a digital representation that is the portion of the digital output signal of the pipelined ADC.

12. The method of claim 11, wherein converting the output voltage comprises buffering the output voltage to provide a current buffered version of the output voltage to a local ADC that is configured to generate the digital representation.

13. The method of claim 11, wherein biasing the feedback transistor-follower combination comprises:
   mirroring a current flow through a P-type metal-oxide semiconductor (PMOS) current mirror based on a current source representative of a least-significant bit (LSB) cell of a local digital-to-analog converter (DAC) associated with the preceding pipeline stage of the pipelined ADC; and
   providing the current flow through an input transistor to the summation node and to an input of a feedback transistor interconnected between the positive source voltage and the summation node.

14. The method of claim 11, further comprising clamping the output voltage upon providing an excessive amount of the second current.

15. The method of claim 14, wherein clamping the output voltage comprises:
   setting a value for a clamping resistor and a bias current source to set a bias voltage magnitude associated with a PNP BJT; and
   activating the PNP BJT to clamp the output voltage upon a base of the PNP BJT being substantially equal to the bias voltage magnitude relative to the output voltage.

16. The method of claim 11, wherein biasing the feedback transistor-follower combination comprises biasing a first feedback transistor-follower combination to set the voltage of a first summation node approximately equal to a positive portion of a differential sample-and-hold voltage associated with the preceding pipeline stage of the pipelined ADC and biasing a second feedback transistor-follower combination to set a voltage of a second summation node approximately equal to a negative portion of the differential sample-and-hold voltage; and
   wherein mirroring the first current comprises mirroring the first current from the positive source voltage to the first summation node through the first feedback transistor-follower combination to provide the second current through a first output resistor to set a positive portion of a differential output voltage of the pipeline stage and mirroring a third current from the positive source voltage to the second summation node through the second feedback transistor-follower combination to provide a fourth current through a second output resistor to set a negative portion of the differential output voltage of the pipeline stage.

17. A pipelined analog-to-digital converter (ADC) comprising a plurality of pipeline stages, at least one of the plurality of pipeline stages comprising:
   means for setting a voltage of a summation node approximately equal to a sample-and-hold voltage associated with a preceding one of the plurality of pipeline stages;
   means for mirroring a first current associated with the means for setting the voltage of the summation node to provide a second current to an output resistor to set an output voltage of the respective at least one of the plurality of pipeline stages based on the second current; and
   means for converting the output voltage to a digital representation that is a portion of a digital output signal of the pipelined ADC.

18. The pipelined ADC of claim 17, further comprising means for current buffering the output voltage before providing the output voltage to the means for converting.

19. The pipelined ADC of claim 17, further comprising means for clamping the output voltage upon an excessive amount of the second current.

20. The pipelined ADC of claim 17, wherein the means for setting the voltage comprises first means for setting the voltage of a first summation node approximately equal to a positive portion of a differential sample-and-hold voltage associated with the preceding one of the plurality of pipeline stages and second means for setting the voltage of a second summation node approximately equal to a negative portion of a differential sample-and-hold voltage associated with the preceding one of the plurality of pipeline stages, and wherein the means for mirroring the first current comprises first means for mirroring the first current associated with the first means for setting the voltage of the first summation node to provide the second current to a first output resistor to set a positive portion of a differential output voltage of the respective at least one of the plurality of pipeline stages and second means for setting a voltage of the second summation node to provide a third current to a second output resistor to set a negative portion of the differential output voltage of the respective at least one of the plurality of pipeline stages.

* * * * *